(12) United States Patent
Nobori

(10) Patent No.: US 10,050,163 B2
(45) Date of Patent: Aug. 14, 2018

(54) SOLAR CELL APPARATUS AND METHOD FOR MANUFACTURING SAME

(71) Applicant: Panasonic Intellectual Property Management Co., Ltd., Osaka (JP)

(72) Inventor: Kazuhiro Nobori, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/440,882

(22) PCT Filed: Apr. 8, 2014

(86) PCT No.: PCT/JP2014/002010
§ 371 (c)(1),
(2) Date: May 6, 2015

(87) PCT Pub. No.: WO2014/167841
PCT Pub. Date: Oct. 16, 2014

(65) Prior Publication Data
US 2015/0295109 A1   Oct. 15, 2015

(30) Foreign Application Priority Data

Apr. 10, 2013   (JP) .................................. 2013-082309

(51) Int. Cl.
*H01L 31/048* (2014.01)
*H02S 30/10* (2014.01)
(Continued)

(52) U.S. Cl.
CPC ........ *H01L 31/048* (2013.01); *H01L 31/0543* (2014.12); *H01L 31/0547* (2014.12);
(Continued)

(58) Field of Classification Search
CPC . H01L 31/0684; H01L 31/048; H01L 31/049; H01L 31/0747; H01L 31/0543;
(Continued)

(56) References Cited

U.S. PATENT DOCUMENTS 3,982,963 A * 9/1976 Mahoney .......... H01L 31/02008
136/251
4,152,174 A * 5/1979 Ludlow ................... H02S 20/32
136/244

(Continued)

FOREIGN PATENT DOCUMENTS

CH          683730      4/1994
JP        62-126850     8/1987

(Continued)

OTHER PUBLICATIONS

Merriam-Webster. "Definition of flat." http://www.merriam-webster.com/dictionary/flat Accessed online Aug. 16, 2016.*

(Continued)

*Primary Examiner* — Liesl C Baumann
(74) *Attorney, Agent, or Firm* — Wenderoth, Lind & Ponack, L.L.P.

(57) ABSTRACT

A solar cell apparatus in which contamination of solar cells is suppressed and a power generation quantity of the solar cells is maintained for a long period of time, even if the solar cell apparatus is disposed outside. The apparatus is provided with: a light transmitting plastic material; a light transmitting back sheet; a plurality of bifacial solar cells that are electrically connected to each other by means of interconnectors; and a transparent filled resin that surrounds the solar cells. The light transmitting plastic material has a curved surface, and is capable of constituting a hermetically closed space by being fixed to a disposition region of a body having the solar cell apparatus disposed thereon. The light trans- (Continued)

mitting back sheet, the solar cells, and the transparent filled resin are disposed in the hermetically closed space.

8 Claims, 15 Drawing Sheets

(51) Int. Cl.
| | |
|---|---|
| *H02S 10/40* | (2014.01) |
| *H01L 31/054* | (2014.01) |
| *H02S 20/30* | (2014.01) |
| *H01L 31/18* | (2006.01) |
| *H01L 31/0747* | (2012.01) |
| *H02S 20/00* | (2014.01) |
| *H02S 40/22* | (2014.01) |
| *H02S 20/10* | (2014.01) |
| *H02S 20/22* | (2014.01) |

(52) U.S. Cl.
CPC .......... *H01L 31/0747* (2013.01); *H01L 31/18* (2013.01); *H02S 10/40* (2014.12); *H02S 20/00* (2013.01); *H02S 20/10* (2014.12); *H02S 20/22* (2014.12); *H02S 20/30* (2014.12); *H02S 30/10* (2014.12); *H02S 40/22* (2014.12); *Y02B 10/10* (2013.01); *Y02E 10/52* (2013.01)

(58) Field of Classification Search
CPC ..... H01L 31/0547; H01L 31/18; H02S 20/10; H02S 20/20–20/22; H02S 20/30; H02S 10/40; H02S 20/23; H02S 30/10; H02S 40/22; H02S 20/00; Y02B 10/10; Y02B 10/52
USPC .................................. 136/243–265
See application file for complete search history.

(56) References Cited

U.S. PATENT DOCUMENTS

| | | | | |
|---|---|---|---|---|
| 4,686,321 A | * | 8/1987 | Kishi | ................ H01L 31/03921 136/244 |
| 4,717,790 A | * | 1/1988 | Gochermann | .... B32B 17/10036 136/251 |
| 5,217,540 A | | 6/1993 | Ogura | |
| 6,331,031 B1 | | 12/2001 | Patz et al. | |
| 7,915,523 B2 | * | 3/2011 | Farhadieh | ........... H01L 31/0547 136/243 |
| 2005/0133082 A1 | * | 6/2005 | Konold | ............... H01L 31/0543 136/246 |
| 2008/0128015 A1 | * | 6/2008 | Shugar | .................. H01L 31/048 136/246 |
| 2011/0132423 A1 | * | 6/2011 | Joge | .................... H01L 31/0236 136/244 |
| 2011/0232757 A1 | * | 9/2011 | Kim | ....................... F24J 2/4612 136/259 |
| 2012/0031463 A1 | * | 2/2012 | Schmaelzle | ................ F24J 2/06 136/246 |
| 2012/0097212 A1 | * | 4/2012 | McCoy, Jr. | ............. H02S 40/22 136/246 |
| 2013/0160824 A1 | * | 6/2013 | Khouri | .................. H01L 31/048 136/251 |
| 2014/0251415 A1 | * | 9/2014 | Inaba | .................. H01L 31/0488 136/251 |

FOREIGN PATENT DOCUMENTS

| | | |
|---|---|---|
| JP | 04-063655 | 5/1992 |
| JP | 06-005901 | 1/1994 |
| JP | 10-229215 | 8/1998 |
| JP | 2002-270881 | 9/2002 |
| JP | 2012-195489 | 10/2012 |
| WO | 2011/117481 | 9/2011 |

OTHER PUBLICATIONS

"Definition of Around" MacMillan Dictionary. http://www.macmillandictionary.com/us/dictionary/american/around Accessed online Feb. 23, 2017.*

International Search Report dated May 13, 2014 in International (PCT) Application No. PCT/JP2014/002010.

Extended European Search Report dated Feb. 19, 2016 in corresponding European patent application No. 14 78 2604.

* cited by examiner

SOLAR CELL APPARATUS AND METHOD FOR MANUFACTURING SAME

BACKGROUND OF THE INVENTION

1. Technical Field

The present invention relates to a solar cell device including a translucent plastic material having a curved surface, and a manufacturing method thereof.

2. Description of the Related Art

Recently, solar cells have attracted much interest as clean energy sources. In particular, silicon solar cells, which have higher power generation efficiency, have been taken into consideration as the most potential power for high-end markets for housing, automobiles, and the like in terms of various installation methods and construction sites. A solar cell typically has solar cell units and a translucent member, and light having passed through the translucent member enters the solar cell unit.

Most of mainstream solar cell devices currently provided have a flat-shaped translucent member. That is, as illustrated in FIG. 15, planar stack 6 of a solar cell device including solar cell units 2 is fixed to a fixing target with frame bodies 7 provided at each of the both sides of planar stack 6 (see PTL 1).

On the other hand, a solar cell device in which a translucent member has a curved surface has also been proposed (PTL 1). Solar cell device 11 illustrated in FIG. 14 has solar cell units 2 and translucent plastic material 12 having curved surfaces at both lateral end portions, and is fixed to a fixing target with frame portions 14 at both the lateral end portions. When the solar cell device illustrated in FIG. 14 is tried to be fixed to an automobile roof, a tile-integrated or building material-integrated house, a ship, and the like, a gap occurs between a mounting portion of the solar cell device and a portion to be installed, making it difficult to bring it into close contact with the portion to be installed. As a result, wind and rain sometimes enter a space occurring between the mounting portion of the solar cell device and the fixing target. In addition, there occurs a useless space. Further, there is also a problem of impaired outer appearance.

Thus, the translucent member of the solar cell device is sometimes required to have a curved surface structure corresponding to the curved surface shape of a portion to be operated such as the automobile roof. However, the solar cell device including the translucent member having the curved surface structure lacks flexural strength at a location with smaller curvature radius of the translucent member, causing the problem of cracks or fractures easily occurring in the solar cell unit.

On the other hand, the translucent member of the currently provided solar cell device is often a glass substrate. Therefore, the weight of the solar cell device for an automobile roof is at least 30 kg. As a result, there occurs a problem of increasing fuel consumption of an automobile having the solar cell device mounted on the automobile roof. To solve this problem, there is also an attempt to provide a solar cell device having structural strength that can resist wind pressure using lightweight translucent plastic material 12 made of polycarbonate in place of the glass substrate (PTL 1).

CITATION LIST

Patent Literature

PTL 1
Japanese Patent Application Laid-Open No. 10-229215

SUMMARY OF THE INVENTION

1. Technical Problem

PTL 1 discloses that a solar cell device provided with translucent plastic material 12 having a curved surface as illustrated in FIG. 14 has a similar strength to that of the solar cell device using a translucent member of tempered glass, thereby overcoming the problem of solar cell devices being destroyed by wind pressure.

The solar cell device illustrated in FIG. 14 is fixed to a fixing target with frame portions 14 provided at a part (two lateral sides) of the outer periphery of a sealing area for solar cell units 2. However, frame portions 14 are provided only at a part of the outer periphery of the sealing area for solar cell units 2, and thus the structural strength of the solar cell device fixed to the fixing target is not sufficient. In addition, there is a problem of wind and rain or dust blowing into the solar cell device through portions not fixed to the fixing target (upper side and lower side). Therefore, the solar cell device disclosed in PTL 1 cannot be used as a member (such as a roof) for closing an automobile interior or a house interior airtight.

In addition, the solar cell device is preferably disposed such that the incidence angle of sunlight relative to its light-receiving surface is right angle, in order to increase the power generation amount. However, the solar cell device disclosed in PTL 1 is required to adjust the angle of the light-receiving surface of the solar cell device using a rack or a frame body for fixing the solar cell device to the fixing target. When the solar cell device disclosed in PTL 1 is installed on a flat place such as a deck roof of factories, or the like, or the ground, for example, it is required that the angle of the light-receiving surface of the solar cell device should be adjusted using a rack or a frame body depending on the angle of sunlight.

Thus, the present invention provides a solar cell device that maintains the amount of power generation of a solar cell unit for a long period of time by preventing the solar cell unit from being stained even being installed outdoors.

2. Solution to the Problem

In view of the above-described conventional problems, in a solar cell device of the present invention including a solar cell unit and a translucent plastic material, an airtight space is formed by the translucent plastic material and a fixing target, to enable the double-sided light-receiving solar cell unit to be disposed in the airtight space. The airtight space is configured not to allow stain due to wind and rain or dust to enter the airtight space. In addition, light reflectivity is preferably imparted to the surface of an installing area of the fixing target where the airtight space is formed.

A first aspect of the present invention is to provide a solar cell device including a translucent plastic material, a translucent back sheet, a plurality of double-sided light-receiving solar cell units being disposed between a sealing area of the translucent plastic material and the translucent back sheet and being electrically connected with each other through an interconnector, and a transparent filling resin surrounding the plurality of solar cell units. The translucent plastic material has a dome-shaped curved surface, and has a frame body being molded at a bottom surface of the dome-shaped translucent plastic material. The frame body is fixed to an installing area of a fixing target on which the solar cell device is installed, to thereby enable the translucent plastic material to form an airtight space. The translucent back sheet, the solar cell unit, and the transparent filling resin are disposed in the airtight space.

The surface of the installing area of the fixing target where the airtight space is formed preferably has light reflectivity.

It is preferable that the fixing target is an automobile body including an automobile roof, and that the solar cell device is fixed to the automobile body of the automobile roof, to thereby prevent wind and rain from the outside from entering the vehicle.

Further, it is preferable that the fixing target is an automobile body having a roof including a sliding plate that takes light into the automobile, and that a light reflector is provided on a surface, facing the solar cell device, of the sliding plate.

A second aspect of the present invention is to provide a method of manufacturing a solar cell device, the method including: preparing a stack including a translucent plastic plate, a translucent back sheet, a plurality of double-sided light-receiving solar cell units being disposed between a sealing area of the translucent plastic material and the translucent back sheet and being electrically connected with each other through an interconnector, and a transparent filling resin surrounding the plurality of solar cell units; and pressing the stack against a molding die provided with a vacuum hole and bending the translucent plastic plate to afford the translucent plastic material.

In the above-described manufacturing method, the stack is preferably prepared by pressurizing and laminating a stacked product of a translucent plastic plate, a translucent back sheet, a plurality of double-sided light-receiving solar cell units being disposed between a sealing area of the translucent plastic material and the translucent back sheet and being electrically connected with each other through an interconnector, a transparent filling resin surrounding the plurality of solar cell units, and an elastic resin sheet.

3. Advantageous Effects of the Invention

As described above, in the solar cell device of the present invention, an airtight space is formed by the translucent plastic material and the fixing target, to allow the double-sided light-receiving solar cell unit to be placed in the airtight space. Therefore, the solar cell unit placed in the airtight space is not easily stained even when the solar cell device is installed outdoors. In addition, since the translucent plastic material and the fixing target can form the airtight space, a rack or a frame body to be used exclusively for fixing the solar cell device is not required.

In addition, the light reflector provided on the surface of the installing area of the fixing target where an airtight space is formed enables light reflected at the surface of the installing area of the fixing target to enter the double-sided light-receiving solar cell unit, thereby allowing the amount of power generation by the solar cell unit to be increased. Further, since the airtight space is configured not to allow the stain due to wind and rain or dust to enter the airtight space, light reflectivity is not decreased. Therefore, it is possible to limit the decrease in the amount of power generation by the solar cell unit.

Thus, the solar cell device of the present invention allows the amount of power generation of the solar cell unit to be higher and the power generation efficiency per unit area to be higher, and is configured not to allow the stain due to wind and rain or dust to enter the airtight space in which the solar cell unit is disposed. Therefore, the solar cell device of the present invention can be used as a member for closing the interior of an automobile or the interior of a house airtight.

DETAILED DESCRIPTION OF THE INVENTION

Hereinafter, embodiments of the present invention will be described with reference to the attached drawings.

[Embodiment 1]

Figure 1A:
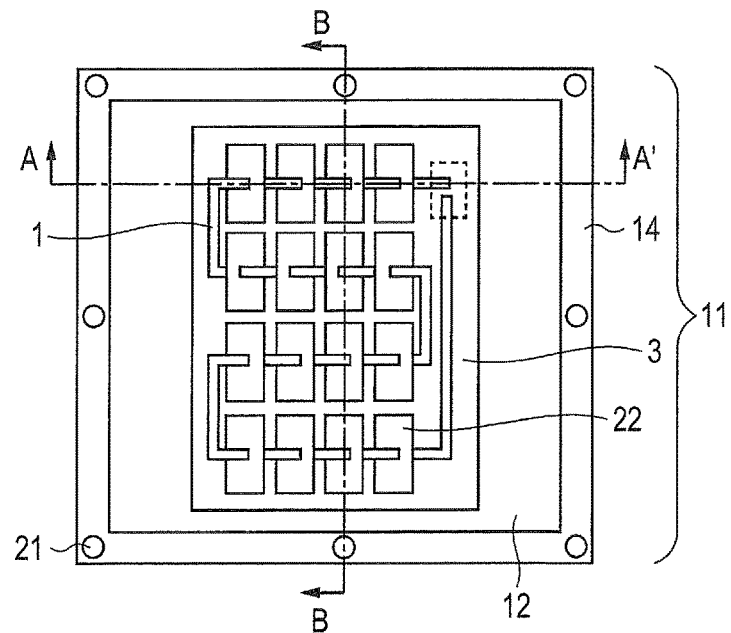
FIG. 1A is a top view of a solar cell device of Embodiment 1.
Figure 1B:
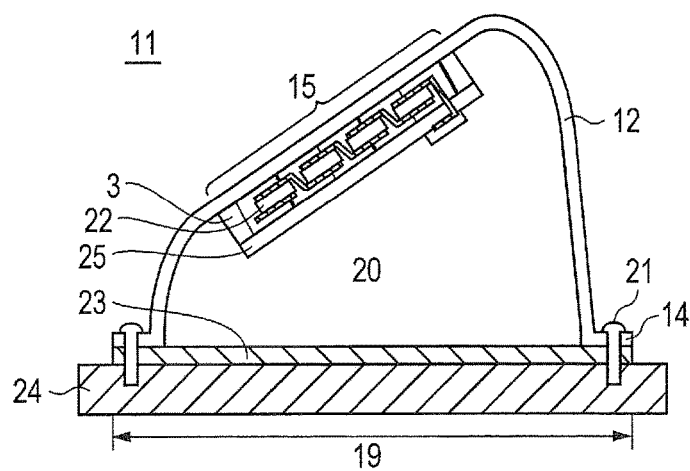
FIG. 1B is a sectional view of the solar cell device of Embodiment 1.
Figure 1C:
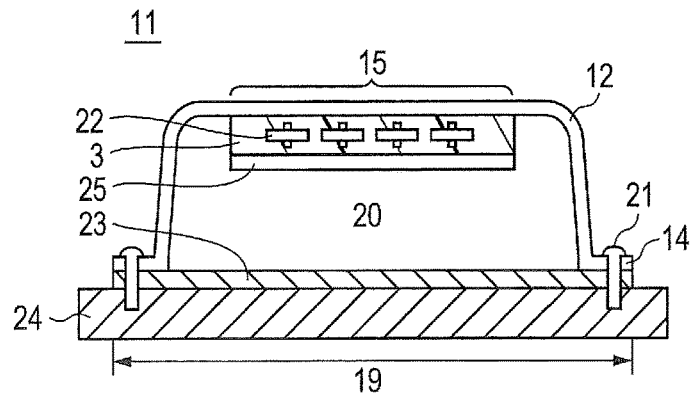
FIG. 1C is a sectional view of the solar cell device of Embodiment 1.

FIGS. 1A to 1C are a top view (FIG. 1A) and sectional views (FIG. 1B (A-A sectional view in FIG. 1A) and FIG.

1C (B-B sectional view in FIG. 1A)) of the solar cell device of Embodiment 1. Solar cell device 11 illustrated in FIGS. 1A to 1C includes a plurality of double-sided light-receiving solar cell units 22. Solar cell units 22 adjacent to each other are electrically connected in series by electrically connecting a light-receiving electrode on the front side of one solar cell unit 22 to a light-receiving electrode on the rear side of the other solar cell unit 22 through interconnector 1. In addition, solar cell device 11 illustrated in FIGS. 1A to 1C includes transparent filling resin 3 that surrounds a plurality of solar cell units 22.

Further, solar cell device 11 illustrated in FIGS. 1A to 1C includes translucent plastic material 12 disposed on the light-receiving surface side of a plurality of solar cell units 22 that perform double-sided power generation, with transparent filling resin 3 interposed therebetween, and translucent back sheet 25 disposed on the rear surface side through transparent filling resin 3, and these components are integrated together.

Figure 13:
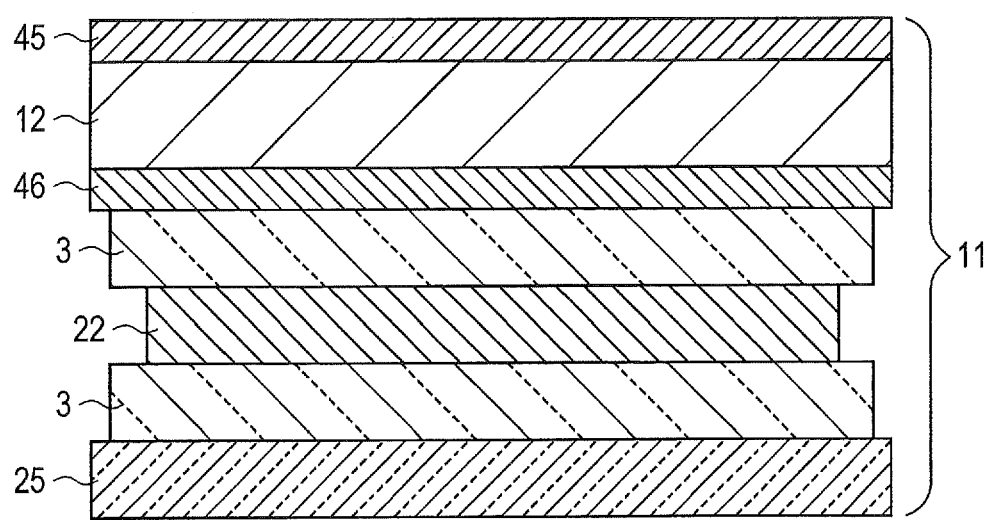
FIG. 13 is a detailed sectional view of a double-sided solar cell device.
Figure 14:
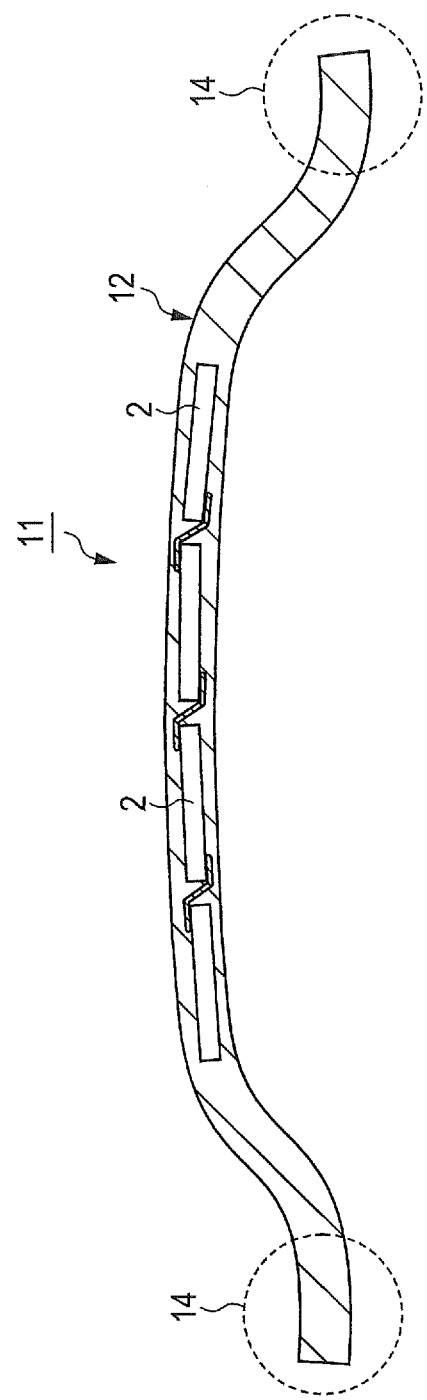
FIG. 14 is a sectional view of a conventional solar cell device.
Figure 15:
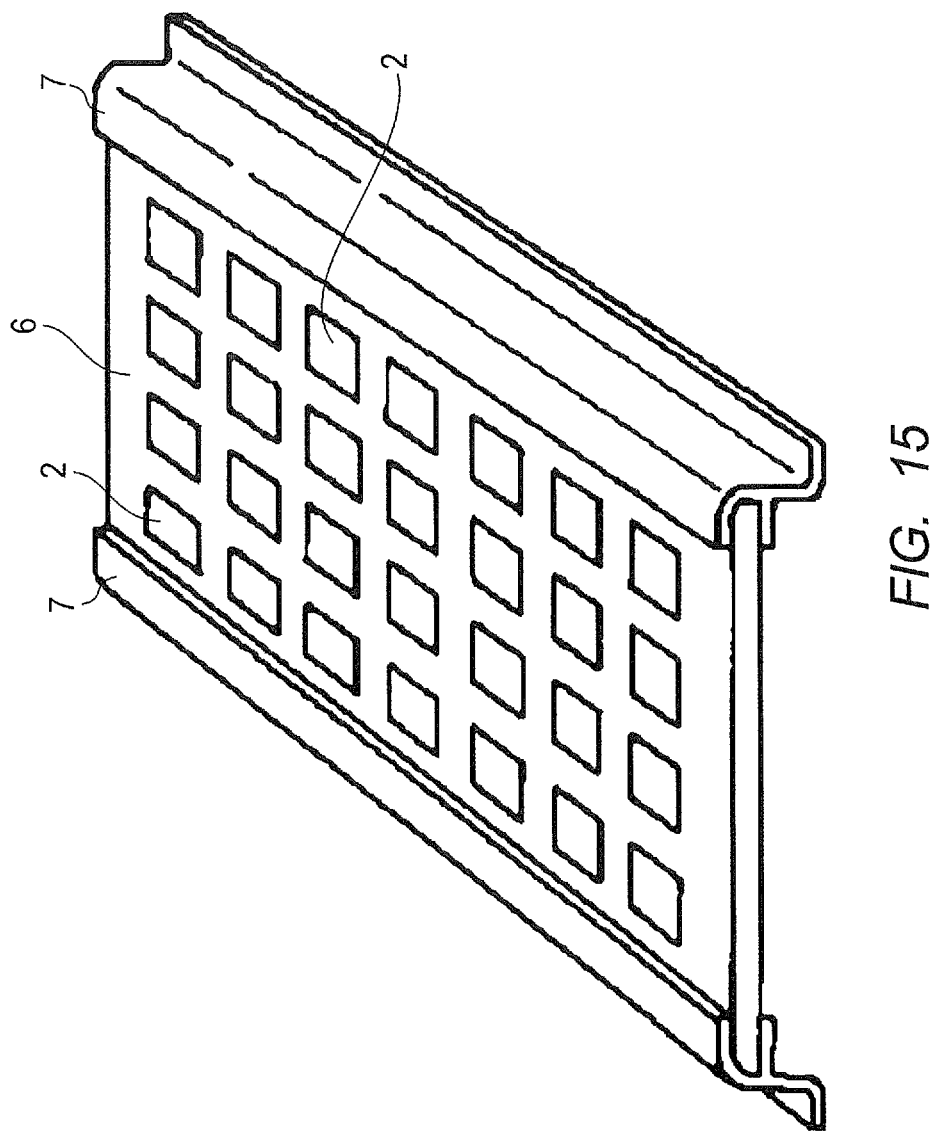
FIG. 15 is a perspective view of the conventional solar cell device.

FIG. 13 illustrates an example of the stacking configuration in sealing area 15 for the solar cell device of Embodiment 1. As illustrated in FIG. 13, the solar cell device of Embodiment 1 includes, from the light-receiving surface side, translucent plastic material 12, transparent filling resin 3, solar cell unit 22 that performs double-sided power generation, transparent filling resin 3, and translucent back sheet 25. A pair of transparent filling resins 3 surround solar cell unit 22 that performs double-sided power generation. Further, close contact layer 46 is formed on a surface, facing solar cell unit 22, of translucent plastic material 12, and waterproof film 45 is formed on the front layer, being exposed to the outside air, of translucent plastic material 12.

Waterproof film 45 has waterproofness, humidity resistance, hardness-enhancing capacity, UV-shielding capacity, and the like. Examples of the material for waterproof film 45 include organic materials excellent in translucency, such as acrylic materials and fluoric materials, and thin metal films such as a gold film. The thin metal films sometimes may have slightly lowered translucency.

The material for translucent plastic material 12 is made of a resin that can secure the amount of light transmission necessary for allowing double-sided light-receiving solar cell unit 22 to generate power; translucent plastic material 12 may include polycarbonate or acrylic resin (PMMA). An antireflective film may be formed on the surface of translucent plastic material 12 (interface with waterproof film 45). The thickness of translucent plastic material 12 in solar cell device 11 of Embodiment 1 is 5 mm.

Further, a gas barrier layer having a steam permeability of 0.2 g/m²·day or less is preferably formed on the front surface or the rear surface, or on both surfaces of translucent plastic material 12. This is because translucent plastic material 12 has higher moisture permeability and water absorption rate than glass substrates. Formation of a gas barrier layer having a steam permeability of 0.2 g/m²·day or less can inhibit transparent filling resin 3 from undergoing hydrolysis due to moisture having permeated translucent plastic material 12. The hydrolysis of transparent filling resin 3 causes the adhesion between translucent plastic material 12 and transparent filling resin 3 to be reduced. In addition, the moisture having permeated translucent plastic material 12 and having entered the interface with transparent filling resin 3 undergoes volume change due to the temperature change when using solar cell device 11, causing translucent plastic material 12 and transparent filling resin 3 to be exfoliated from each other, and causing the exfoliated portion to be further expanded. Further, the moisture having permeated translucent plastic material 12 and transparent filling resin 3 sometimes deteriorates the surface of the solar cell unit or a junction between the solar cell units.

Double-sided light-receiving solar cell unit 22 is a solar cell unit that converts sunlight incident on both surfaces into electricity, and is represented by HIT (registered trademark, Panasonic Corporation), or the like. Double-sided light-receiving solar cell unit 22 has, for example, a structure in which a P amorphous layer is provided on one surface of N-type monocrystalline silicon, and an N amorphous layer is provided on the other surface. The thickness of solar cell unit 22 that performs double-sided power generation in solar cell device 11 of Embodiment 1 is 130 μm.

Solar cell unit 22 in solar cell device 11 of Embodiment 1 includes a p-type monocrystalline silicon substrate having a resistivity of 1 Ω·cm and a thickness of 350 μm. A texture structure (not illustrated) is formed on both surfaces of the p-type monocrystalline silicon substrate. The texture structure has such an irregular shape as to reduce light reflection on its surface. The texture structure is formed, for example, by wet etching the surface of the silicon substrate with an alkali solution.

Solar cell unit 22 may include a silicon substrate such as a polycrystalline silicon substrate in place of the monocrystalline silicon substrate. A texture structure can be formed on the surface of the polycrystalline silicon substrate using an acid solution. Further, solar cell unit 22 may include a compound-based semiconductor such as GaAs or Ge semiconductor in place of the silicon substrate, thereby allowing solar cell unit 22 to be a compound-based solar cell.

An n-type layer is formed on one surface of the p-type monocrystalline silicon substrate included in solar cell unit 22. The n-type layer may have a thickness that is the depth of up to about 1 μm from one surface of the p-type monocrystalline silicon substrate. The n-type layer is formed by exposing one surface of the p-type monocrystalline silicon substrate to a phosphorus oxychloride gas ($POCl_3$ gas) at 900° C. followed by thermal diffusion of P (phosphorus). Phosphorus glass (PSG) is sometimes used in place of the phosphorus oxychloride gas.

Solar cell unit 22 has an antireflective film formed on a light-receiving surface of the p-type monocrystalline silicon substrate. The antireflective film is made of SiNx, for example, and may be formed by plasma CVD method. Further, solar cell unit 22 has a finger-shaped Ag electrode disposed on the antireflective film. The Ag electrode is formed by printing an Ag paste followed by heat treatment. The heat treatment allows Ag to penetrate into SiNx that is an antireflective film, and allows Ag to contact the surface of the n-type layer. Such heat treatment is referred to as fire-through (penetration firing).

A rear surface electrode made of Al is disposed on the other surface (rear surface) of the p-type monocrystalline silicon substrate included in solar cell unit 22. The rear surface electrode made of Al is formed by screen printing of an Al paste on the rear surface of the p-type monocrystalline silicon substrate. Further, heat treatment at about 700° C. for a short period of time allows Al to be thermally diffused in the silicon substrate. Thus, a p-type layer in which Al is highly doped is also formed together.

Through these steps, solar cell unit 22 can be obtained that has a double-sided amorphous layer in the silicon substrate and Ag interconnection on the silicon substrate, and that performs double-sided power generation.

Transparent filling resin 3 is a resin layer surrounding solar cell unit 22; typically a pair of transparent filling resins 3 interpose solar cell unit 22 between the upper one and the lower one of the pair of transparent filling resins 3. The thickness of each of transparent filling resins 3 in solar cell device 11 of Embodiment 1 is 0.6 mm.

Transparent filling resin 3 is mainly composed of ethylene, and includes a copolymer of ethylene and a monomer that is polymerizable with ethylene. Examples of the copolymer include copolymers of ethylene and vinyl esters such as vinyl acetate, and vinyl propionate; copolymers of ethylene and unsaturated carboxylic acids such as methyl acrylate, ethyl acrylate, isobutyl acrylate, n-butyl acrylate, and methyl methacrylate, or ionomers thereof; copolymers of ethylene and α-olefins such as propylene, 1-butene, 1-hexene, 1-octene, and 4-methyl-1-pentene; and mixtures thereof. More typically, examples of transparent filling resin 3 include ethylene vinyl acetate copolymer resin (EVA).

Transparent filling resin 3 may be a cross-linked product of a resin composition including the copolymer and a cross-linking agent. The cross-linking agent is, for example, an organic peroxide, and preferably has a decomposition temperature (temperature at which half-life period is 1 hour) of 90° C. to 180° C. Examples of the organic peroxide include t-butylperoxyisopropyl carbonate, t-butylperoxy acetate, t-butylperoxy benzoate, dicumyl peroxide, 2,5-dimethyl-2,5-bis(t-butylperoxy)hexane, di-t-butyl peroxide, 2,5-dimethyl-2,5-bis(t-butylperoxy)hexyne-3,1,1-bis(t-butylperoxy)-3,3,5-trimethylcyclohexane, 1,1-bis(t-butylperoxy)cyclohexane, methylethylketone peroxide, 2,5-dimethylhexyl-2,5-bisperoxy benzoate, t-butyl hydroperoxide, p-menthane hydroperoxide, benzoyl peroxide, p-chlorobenzoyl peroxide, t-butylperoxy isobutyrate, hydroxyheptyl peroxide, and dicyclohexanone peroxide.

In addition, transparent filling resin 3 may be a cross-linked product of a resin composition including a cross-linking auxiliary together with the copolymer and the cross-linking agent. The cross-linking auxiliary enables a cross-linking reaction to easily proceed. Examples of the cross-linking auxiliary include triallyl cyanurate, triallyl isocyanurate, ethyleneglycol dimethacrylate, trimethylolpropane trimethacrylate divinylbenzene, and diallyl phthalate.

Further, transparent filling resin 3 may be a reactant of a resin composition including the copolymer and an adhesion prompter. The adhesion prompter enhances the adhesiveness between translucent plastic material 12 and transparent filling resin 3. The adhesion prompter is a silane coupling agent, or the like. Examples of the silane coupling agent include vinyl triethoxysilane, vinyl tris(β-methoxy-ethoxy) silane, γ-glycidoxypropyltrimethoxysilane, and γ-aminopropyltriethoxysilane.

A terminal group of the silane coupling agent included in transparent filling resin 3 and a hydroxyl group (OH group) on the surface of translucent plastic material 12 undergo a hydrolysis•polymerization reaction, thereby bringing about adhesion between translucent plastic material 12 and transparent filling resin 3.

When a silane coupling agent is not added to transparent filling resin 3, adhesion between transparent filling resin 3 and translucent plastic material 12, or adhesion between transparent filling resin 3 and translucent back sheet 25 is decreased, which may sometimes causes exfoliation. Therefore, problems may occur, in which panel strength at the time when transporting and using the solar cell device cannot be secured, outer appearance is impaired, or the characteristics of electricity generated by the solar cell device are decreased.

Transparent filling resin 3 may be further mixed with various other additives. Examples of the additives include ultraviolet absorbers, light stabilizers and antioxidants, for preventing the deterioration due to ultraviolet rays in sunlight. Examples of the ultraviolet absorbers include benzophenone-based ultraviolet absorbers such as 2-hydroxy-4-methoxybenzophenone, 2-2-hydroxy-4-methoxybenzophenone, 2-hydroxy-4-methoxy-2-carboxybenzophenone, and 2-hydroxy-4-n-octoxybenzophenone; benzotriazole-based ultraviolet absorbers such as 2-(2-hydroxy-3,5-di-t-butylphenyl)benzotriazole, 2-(2-hydroxy-5-methylphenyl)benzotriazole, and 2-(2-hydroxy-5-t-octylphenyl)benzotriazole; and salicylate ester-based ultraviolet absorbers such as phenyl salicylate, and p-octylphenyl salicylate. Examples of the light stabilizers include hindered amine-based light stabilizers. Examples of the antioxidants include hindered phenol-based and phosphite-based antioxidants.

Examples of translucent back sheet 25 include PET films, polyester films, glass cloth transparent films, acrylic films, and vinyl chloride films. In addition, translucent back sheet 25 may be a stacked film in which transparent conductive materials such as ITO and ZnO are stacked on these films. The thickness of translucent back sheet 25 in the solar cell device of Embodiment 1 is 0.05 mm.

As illustrated in FIGS. 1A to 1C, solar cell device 11 of Embodiment 1 forms airtight space 20 with translucent plastic material 12 and fixing target 24. That is, translucent plastic material 12 has a dome-shaped curved surface structure, and thus can form airtight space 20.

In addition, translucent plastic material 12 has frame portion 14 on the bottom surface of the dome. Translucent plastic material 12 is fixed to installing area 19 of fixing target 24 via frame portion 14. In order to fix translucent plastic material 12 to fixing target 24, frame portion 14 may be fixed to fixing target 24 using fixing screw 21 or an adhesive. Frame portion 14 of translucent plastic material 12 preferably surrounds the four sides of installing area 19. This is because the airtightness of airtight space 20 should be enhanced.

Thus, there is no need for an aluminum frame as the frame body for fixing the solar cell device, or for a rack to be used exclusively for fixing the solar cell device to the ground or a roof, since frame portion 14 of translucent plastic material 12 is fixed to fixing target 24.

While fixing target 24 for fixing solar cell device 11 is not particularly limited, fixing target 24 may be the ground, a concrete member, a building, an automobile roof, or the like.

Double-sided light-receiving solar cell unit 22 is disposed on the inner surface of translucent plastic material 12 of airtight space 20. An area in which solar cell unit 22 is disposed is referred to as sealing area 15. Solar cell unit 22 is surrounded by transparent filling resin 3. Solar cell unit 22 and transparent filling resin 3 are disposed between sealing area 15 of translucent plastic material 12 and translucent back sheet 25. Enhancement of airtightness of airtight space 20 can prevent solar cell unit 22 provided inside airtight space 20 from being stained by wind and rain or dust, when the solar cell device is installed outdoors.

Light reflector 23 is preferably provided on the surface of installing area 19 of fixing target 24 where airtight space 20 is formed. Thus, disposing light reflector 23 inside airtight space 20 imparts light reflectivity to the surface of installing area 19. Sunlight reflected by light reflector 23 enters double-sided light-receiving solar cell unit 22 to undergo photoelectric conversion. In addition, light reflector 23 is disposed inside the airtight space formed by translucent plastic material 12, and thus is prevented from being stained with wind and rain or dust from the external environment, allowing light reflectivity to be maintained. As a result, the amount of power generation of solar cell unit 22 can be maintained for a long period of time.

The surface of sealing area 15 of translucent plastic material 12, fixed to fixing target 24, of the solar cell device of Embodiment 1 is not parallel to the surface of fixing target 24 (see FIG. 1B). Specifically, the surface of sealing area 15 of translucent plastic material 12 is preferably set so as to be at right angle relative to the incident angle of sunlight, in order that the amount of power generation by solar cell unit 22 reaches the maximum. As for the angle of the surface of sealing area 15, the shape of a molding die of translucent plastic material 12 may be adjusted.

Thus, since translucent plastic material 12 can form an airtight space together with the fixing target, solar cell device 11 of Embodiment 1 can close an automobile interior or a house interior (inhibit wind and rain or dust from blowing into the interiors) airtight even when being installed on the roof of the automobile or the house. Further, appropriate setting of the shape of the translucent plastic material enables the angle of the surface of the sealing area to be adjusted. Therefore, it becomes possible to obtain the maximum amount of power generation of the solar cell unit by setting the shape of the translucent plastic material such that the incident angle of sunlight is orthogonal to the surface of the sealing area.

With the above-described configurations, the solar cell device 11 of Embodiment 1 can protect solar cell unit 22 from wind and rain or from dusty outside air, enabling a highly reliable solar cell device to be provided.

[Method of Manufacturing Solar Cell Device]

The manufacturing flows of the solar cell device of Embodiment 1 will be described with reference to FIGS. 2A to 2C, 3A to 3C, 4A, 4B, 5A, 5B; and 6.

Figure 2A:
FIG. 2A illustrates a manufacturing flow of the solar cell device of Embodiment 1.

As illustrated in FIG. 2A, tabular translucent plastic material 12 is prepared. Tabular translucent plastic material 12 is molded to form translucent plastic material 12 having a curved surface. Translucent plastic material 12 is required to have higher light transmissivity; the average light transmittance of the entire wavelength of sunlight is preferably 95 to 98%, although light in UV wavelength range may be absorbed depending on material properties.

Figure 2B:
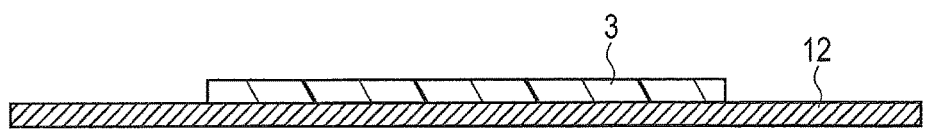
FIG. 2B illustrates the manufacturing flow of the solar cell device of Embodiment 1.

Next, as illustrated in FIG. 2B, a film made of transparent filling resin 3 cut into a predetermined size is pasted on translucent plastic material 12 at normal temperature. The thickness of the film made of transparent filling resin 3 is appropriately set depending on the thickness of solar cell unit 22, the curved surface shape of translucent plastic material 12, or the like; the thickness of the film is set within a range of 0.2 to 2 mm, for example, and is 0.6 mm in the present embodiment 1. In addition, the film made of transparent filling resin 3 either may be one film, or may be a stack of two or more films; further the number of film may be different from area to area.

Figure 2C:
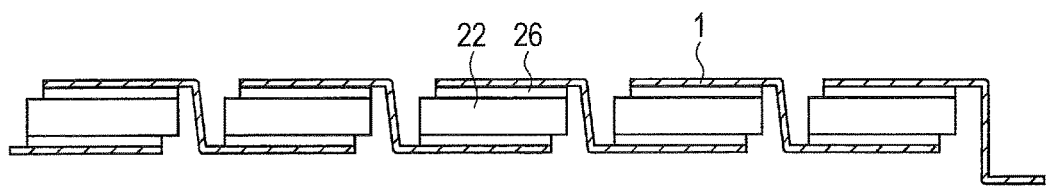
FIG. 2C illustrates the manufacturing flow of the solar cell device of Embodiment 1.

As illustrated in FIG. 2C, a plurality of solar cell units 22 are connected through interconnectors 1. That is, a front surface electrode of one solar cell unit 22 is connected to a rear surface electrode of the other solar cell unit 22 through interconnector 1. Interconnector 1 is joined to the front surface electrode or the rear surface electrode of solar cell unit 22 by joining material 26.

In order to extract power generated by solar cell unit 22, electrical conduction and mechanical joining strength resistant to a temperature cycle and a high temperature and high humidity testing are required between the front and rear surface electrodes of solar cell unit 22 and interconnector 1. Therefore, as joining material 26, in general, a soldering material such as SnPb, SnAgCu and SnAgBi, an anisotropic conductive film referred to as ACF, an adhering paste having an epoxy as a main component referred to as a non-anisotropic conductive paste (NCP), or the like is used.

In order to join interconnector 1 to the front and rear surface electrodes of solar cell unit 22 using joining material 26, 1) joining material 26 is supplied to the front and rear surface electrodes of solar cell unit 22 by means of printing, application, pasting, or the like; 2) interconnector 1 is positioned on the front and rear surface electrodes of solar cell unit 22; and 3) interconnector 1 is pressurized against both surfaces of solar cell unit 22 concurrently to be bonded to both the surfaces of solar cell unit 22 using a heating and pressurizing head to allow joining material 26 to be melted and then hardened. In the general condition for pressure bonding, pressure-bonding is performed at 170° C. to 250° C. for 5 to 10 seconds, for example. Joining is performed for each of solar cell units 22 to electrically connect a plurality of solar cell units 22 in series.

Figure 3A:
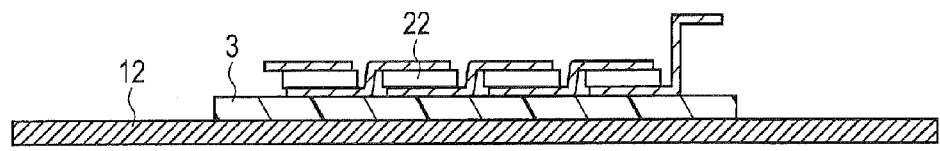
FIG. 3A illustrates the manufacturing flow of the solar cell device of Embodiment 1.

As illustrated in FIG. 3A, in the next step, the plurality of solar cell units 22 connected through interconnector 1 are positioned on transparent filling resin 3. Positioning fiducial mark is preferably provided in advance at a predetermined position of transparent plastic material 12. Using the fiducial mark as a reference, the plurality of solar cell units 22 can be disposed collectively on transparent filling resin 3. Since the plurality of solar cell units 22 are collectively mounted, damage to solar cell units 22 and defects such as disconnection of interconnector 1 should be noted.

Figure 3B:
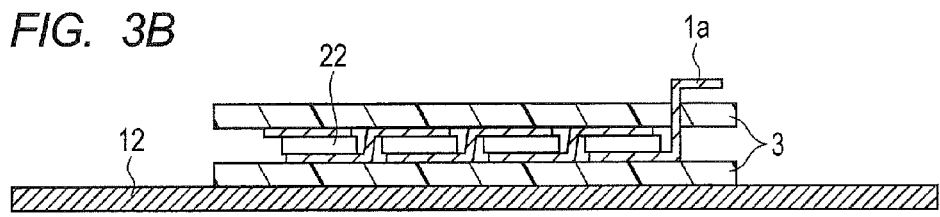
FIG. 3B illustrates the manufacturing flow of the solar cell device of Embodiment 1.

Next, as illustrated in FIG. 3B, transparent filling resin 3 to make a pair is mounted on the plurality of solar cell units 22 while positioning transparent filling resins 3. Transparent filling resin 3 is cut, from which lead-out portion 1a of interconnector 1 is led to the outside.

Figure 3C:
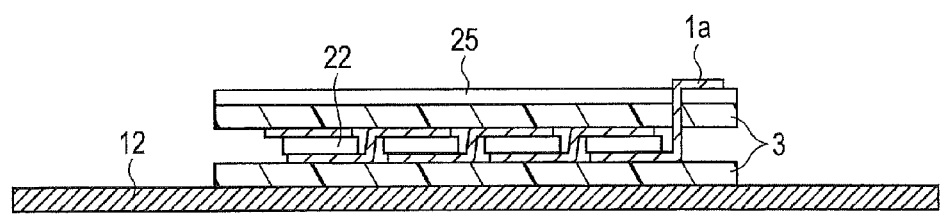
FIG. 3C illustrates the manufacturing flow of the solar cell device of Embodiment 1.

Next, as illustrated in FIG. 3C, translucent back sheet 25 is mounted on transparent filling resin 3 on the plurality of solar cell units 22 while positioning translucent back sheet 25. Translucent back sheet 25 is cut, from which lead-out portion 1a part of interconnector 1 is led to the outside. Thus, a stacked product is afforded, in which translucent plastic material 12, a pair of transparent filling resin 3, solar cell units 22, and translucent back sheet 25 are stacked.

Figure 4A:
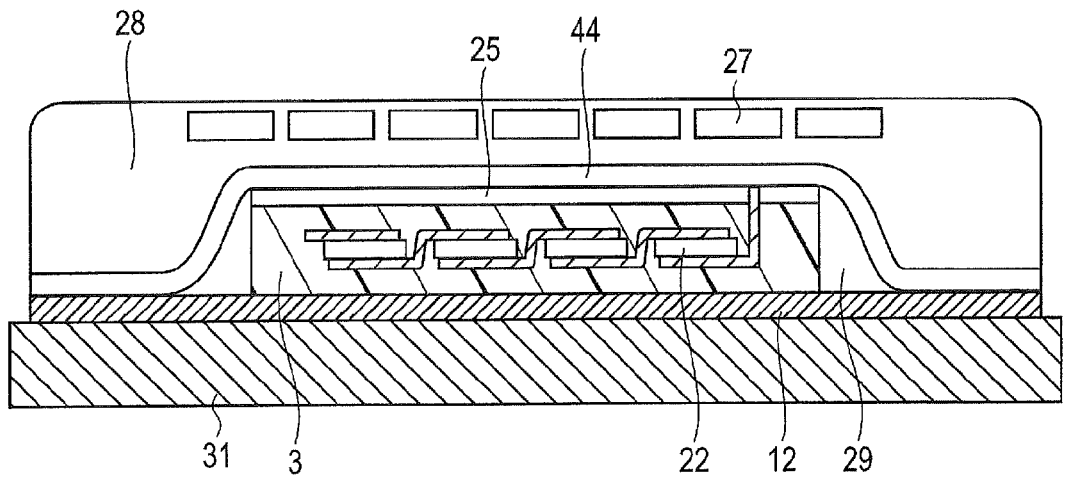
FIG. 4A illustrates the manufacturing flow of the solar cell device of Embodiment 1.

As illustrated in FIG. 4A, in the next step, the stacked product afforded in the step illustrated in FIG. 3C is laminated to afford an integrated stacked product. In the laminating step illustrated in FIG. 4A, pressure is applied to the stacked product afforded in the step illustrated in FIG. 3C through elastic material sheet 44. Applying pressure to the stacked product through elastic material sheet 44 makes it possible to apply pressure to translucent plastic material 12 evenly.

The antireflective film and gas barrier layer formed on translucent plastic material 12 sometimes have moisture absorbed inside. The absorbed moisture is preferably removed from translucent plastic material 12 in order that the moisture should not undesirably occur as a bubble due to heating in the laminating step. In order to remove the moisture from translucent plastic material 12, the stack may be dried at 120° C. for 5 hours in advance, for example. It is preferable to store the stack together with silica gel in an airtight state and to use the stack in the laminating step immediately after opening the sealing.

In the laminating step illustrated in FIG. 4A, the above-mentioned stacked product is heated using heating metal plate 31 at the lower portion and heater 27 at the upper portion to a temperature equal to or lower than the glass transition temperature of translucent plastic material 12

(e.g., 150° C.). Thus, transparent filling resin 3 of the stacked product is sufficiently melted. At that time, the internal pressures of vacuum pressure furnace 28 and vacuum furnace 29 are lowered to 130 Pa or lower as a criterion, in order that a cross-linking reaction of transparent filling resin 3 should not be initiated. Specifically, vacuum drawing steps inside vacuum pressure furnace 28 and vacuum furnace 29 are performed for 10 to 30 minutes.

In the laminating step, elastic material sheet 44 contacts translucent back sheet 25. However, the internal pressure of vacuum pressure furnace 28 and the internal pressure of vacuum furnace 29 are controlled to be identical, and thus translucent back sheet 25 is hardly pressurized by elastic material sheet 44. Therefore, the cross-linking reaction is not initiated.

Next, while maintaining the vacuum inside vacuum furnace 29, air is put into vacuum pressure furnace 28 to adjust the internal pressure of vacuum pressure furnace 28 to a range of 0.5 to the maximum of 2 atmospheres. Consequently, elastic material sheet 44 pressurizes translucent back sheet 25 to allow the cross-linking reaction of transparent filling resin 3 to proceed sufficiently. The time for pressurization is 5 to 15 minutes, for example. In addition, in order to allow the cross-linking reaction of transparent filling resin 3 to proceed sufficiently in a short period of time, it is also possible to put hot air (up to the maximum of 200° C.) into vacuum pressure furnace 28 instead of normal temperature air.

With the above-described laminating step, the cross-linking reaction of transparent filling resin 3 is initiated, and translucent plastic material 12, solar cell unit 22 and translucent back sheet 25 are brought into close contact with one another and are integrated to form a stack. Subsequently, the stack undergoes curing step at about 100° C. to 150° C. for about 30 to 90 minutes so as to complete the cross-linking reaction of transparent filling resin 3.

Figure 4B:
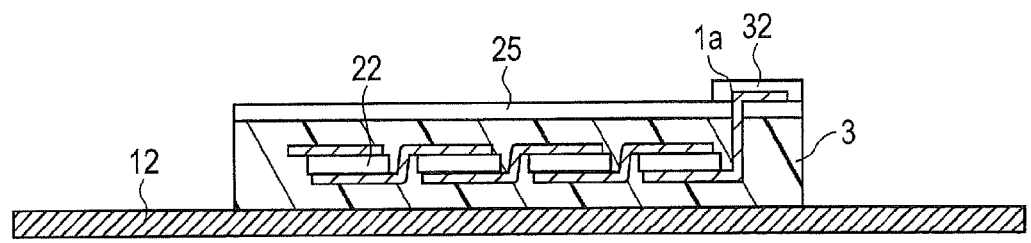
FIG. 4B illustrates the manufacturing flow of the solar cell device of Embodiment 1.

As illustrated in FIG. 4B, in the next step, terminal box 32 is attached to translucent back sheet 25. The inside of terminal box 32 is typically subjected to insulation treatment and waterproof and moisture-proof treatments using silicone grease. The power generated by solar cell unit 22 is electrically led out through interconnector 1, and led out to the outside at lead-out portion 1a. Lead-out portion 1a is electrically connected to terminal box 32 using soldering or a welding method.

Interconnector 1 is connected to the external wiring at terminal box 32. For example, solar cell devices 11 (FIGS. 1A to C) are electrically connected via terminal box 32, and a plurality of electrically connected solar cell devices 11 form a solar cell system.

Figure 5A:
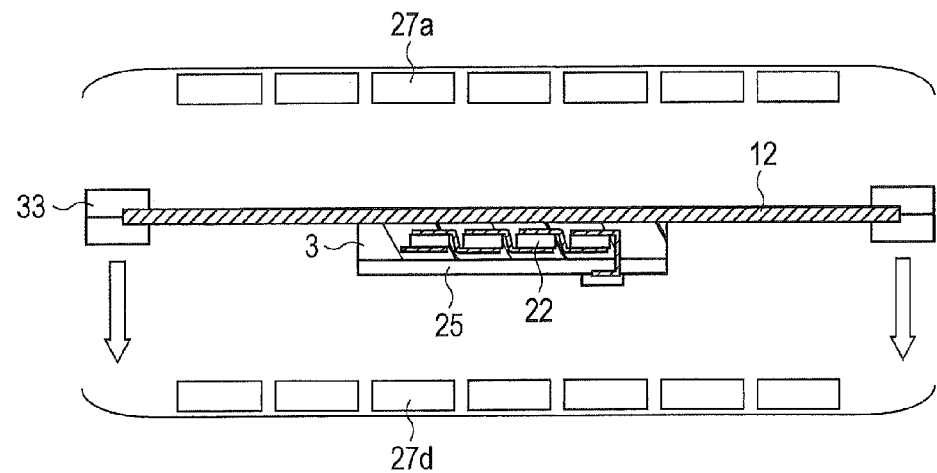
FIG. 5A illustrates the manufacturing flow of the solar cell device of Embodiment 1.
Figure 5B:
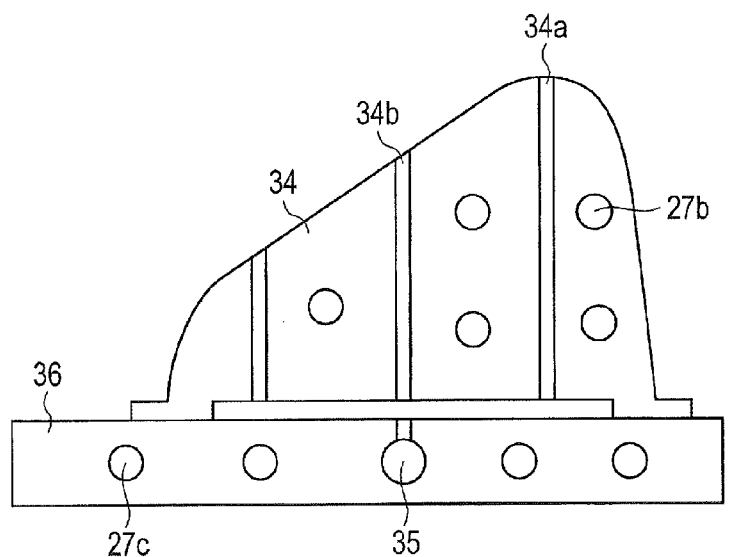
FIG. 5B illustrates the manufacturing flow of the solar cell device of Embodiment 1.

As illustrated in FIGS. 5A and 5B, in the next step, translucent plastic material 12 of the stack afforded in the step illustrated in FIG. 4B is molded into a shape having a predetermined curved surface, and frame portion 14 (see FIGS. 1A to C) is molded. This step is referred to as a vacuum molding step.

In the first step of the vacuum molding step, the stack afforded in the step illustrated in FIG. 4B is subjected to baking treatment in order to remove the moisture inside translucent plastic material 12. The baking temperature is set to be equal to or lower than the glass transition temperature of the material for translucent plastic material 12, typically to 100° C. to 150° C. While the time for baking translucent plastic material 12 having been stored under high humidity environment is not particularly limited, the baking time is set within "square value of thickness (mm)×1 hour." For example, when the thickness of translucent plastic material 12 is 5 mm, the time of within 25 (=5×5) hours is set as a criterion. When the thickness of translucent plastic material 12 having been stored properly under low humidity environment is 5 mm, the baking time may be 5 to 10 hours.

In the second step of the vacuum molding step, the peripheral portion of translucent plastic material 12 immediately after taken out from the bake furnace is interposed by fixing frame 33 of the vacuum molding machine to fix the peripheral portion. At that time, solar cell unit 22 is set so as to face molding die 34 (see FIG. 5A).

In the third step of the vacuum molding step, the temperatures of upper heater 27a and lower heater 27d are raised to heat translucent plastic material 12. The temperatures of upper heater 27a and lower heater 27d are set, for example, within a range of 300° C. to 500° C. such that the temperature of translucent plastic material 12 is within a range of 150° C. to 200° C. that is equal to or more than the glass transition temperature (Tg) of the material for translucent plastic material 12, thereby making it easier to mold translucent plastic material 12 into a desired shape.

Concurrently, the temperatures of heater 27b provided inside molding die 34 and of heater 27c of molding die mounting base 36 are also raised (see FIG. 5B). The temperatures of heaters 27b and 27c are preferably temperatures at which translucent plastic material 12 is easily transformed, and at which translucent plastic material 12 is curable by cooling.

In the fourth step of the vacuum molding step, the temperature of translucent plastic material 12 reaches a predetermined temperature (e.g., is allowed to reach 150° C. to 180° C. over about 1 to 3 minutes), and subsequently a member composing lower heater 27d is removed, such that translucent plastic material 12 and fixing frame 33 can be moved up to molding die 34 (such that lower heater 27d should not interfere with the movement).

Figure 6:
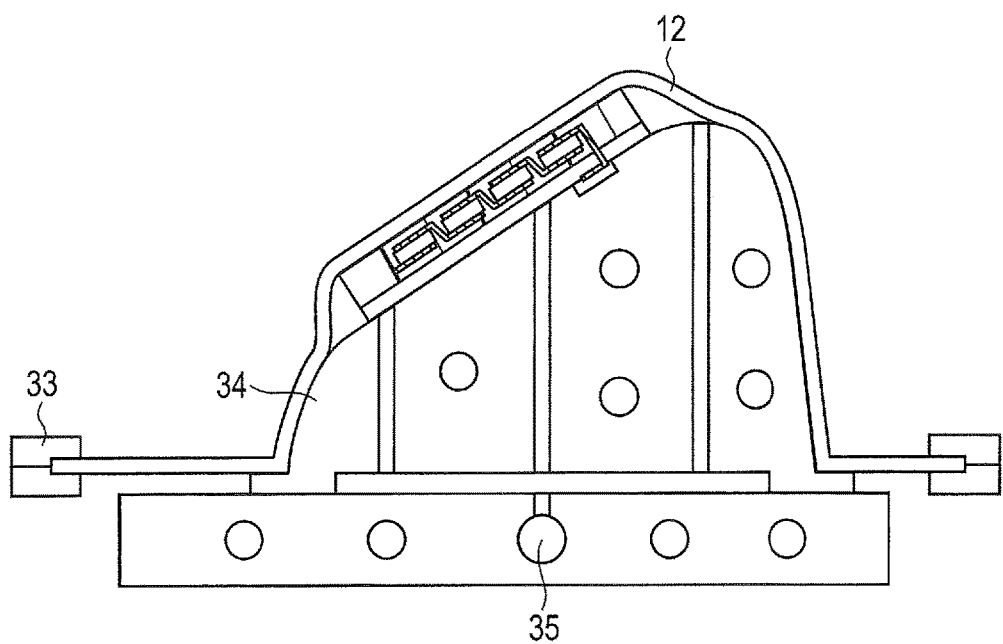
FIG. 6 illustrates the manufacturing flow of the solar cell device of Embodiment 1.

As illustrated in FIG. 6, translucent plastic material 12 is molded into a desired shape by vacuum molding. Fixing frame 33 is allowed to descend to bring translucent plastic material 12 integrated with solar cell unit 22 into contact with vertex portion 34a (see FIG. 5B) of molding die 34. Further, fixing frame 33 is continuously allowed to descend. When fixing frame 33 contacts vertex portion 34a, vacuum pumps connected to a plurality of vacuum holes 35 suck air from vacuum holes 35 on the surface of molding die 34.

Translucent plastic material 12 softened by heating is allowed to descend by fixing frame 33 to contact molding die 34. Since air is sucked from vacuum holes 35, softened translucent plastic material 12 is brought into close contact with molding die 34. As a result, the shape of molding die 34 is transferred to translucent plastic material 12.

The heat of translucent plastic material 12 having contacted molding die 34 is transmitted to molding die 34. As a result, translucent plastic material 12 is hardened due to temperature decrease. In order to lower the temperature of translucent plastic material 12 efficiently, air may be blown from the outside using a fan.

After sufficient hardening is confirmed when the temperature of translucent plastic material 12 is lowered to 70° C. or lower, air is blown through vacuum holes 35, so that translucent plastic material 12 is released from molding die 34 by the air blow. Further, translucent plastic material 12 is allowed to ascend by fixing frame 33 to separate translucent plastic material 12 from molding die 34.

Next, translucent plastic material 12 fixed by fixing frame 33 is disengaged to remove translucent plastic material 12. Through the series of vacuum molding, solar cell device 11 of Embodiment 1 (FIGS. 1A, 1B and 1C) is obtained. The solar cell device of Embodiment 1 includes translucent plastic material 12 having a dome-shaped curved surface, and frame portion 14 on the bottom surface of the dome. While FIG. 6 illustrates the cross-section of translucent plastic material 12 and the molding device, the solar cell device to be obtained has dome-shaped translucent plastic material 12, as illustrated in FIGS. 1A, 1B and 1C.

Thus, the translucent plastic material of the solar cell device is molded by the method in which the translucent plastic material is pressed against the molding die provided with the vacuum holes, to thereby enable a desired curved surface to be formed on the translucent plastic material.

[Embodiment 2]

Figure 7:
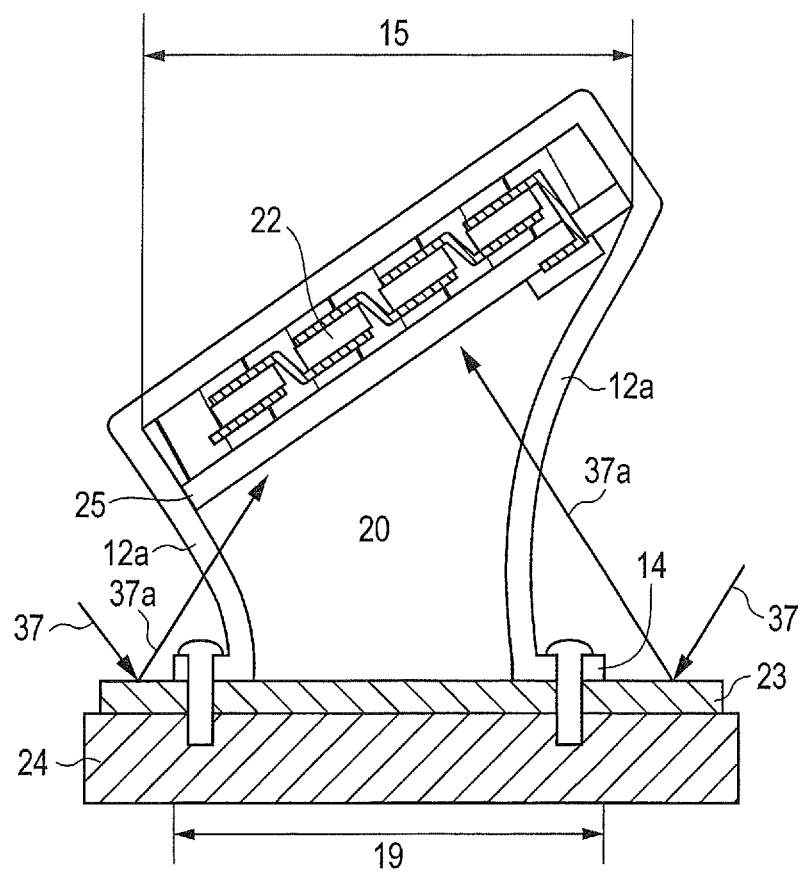
FIG. 7 is a sectional view of a solar cell device of Embodiment 2.

FIG. 7 illustrates a solar cell device of Embodiment 2. The solar cell device of Embodiment 2 has concave curved surface 12a being concave with respect to the outer space, at a portion other than sealing area 15 (side surface portion) of translucent plastic material 12 of solar cell unit 22. Providing concave curved surface 12a at the side surface portion enables the area of installing area 19 to be smaller than the area of sealing area 15 for solar cell unit 22. When the area of installing area 19 is set smaller, it becomes possible to increase ratio of the area of sealing area 15 for solar cell unit 22 to the area of fixing target 24. As a result, the efficiency in installing the solar cell device is enhanced.

In addition, providing concave curved surface 12a at the side surface portion of translucent plastic material 12 allows the incident angle of sunlight 37 reflected at the surface of fixing target 24 outside installing area 19 into the side surface of translucent plastic material 12 to be larger. Therefore, there is less light reflected at the side surface. As a result, sunlight 37 reflected at the surface of fixing target 24 outside installing area 19 easily enters double-sided light-receiving solar cell unit 22, thereby enabling the amount of power generation of solar cell unit 22 to be increased.

[Embodiment 3]

Figure 8:
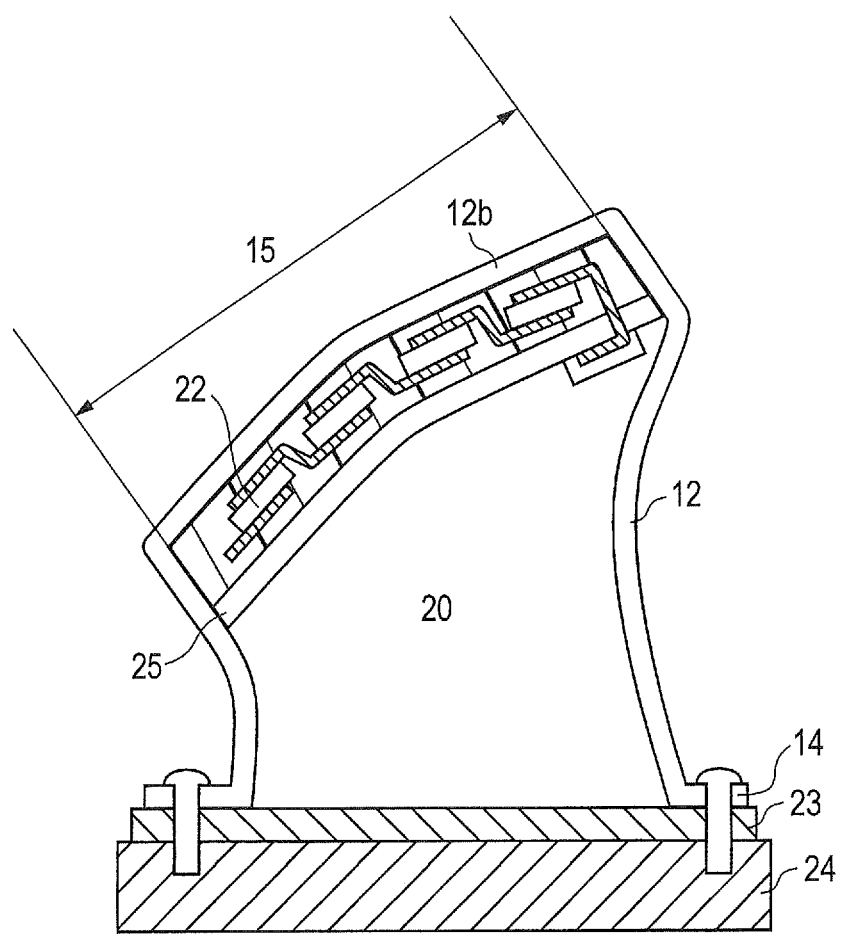
FIG. 8 is a sectional view of a solar cell device of Embodiment 3.

FIG. 8 illustrates a solar cell device of Embodiment 3. The solar cell device of Embodiment 3 has convex curved surface 12b being convex with respect to the outer space, at the surface of sealing area 15 of translucent plastic material 12 for solar cell unit 22. Providing convex curved surface 12b at sealing area 15 for solar cell unit 22 allows the rigidity of the solar cell device to be enhanced. In addition, it is also possible to bring the incident angle of sunlight into the surface of sealing area 15 for solar cell unit 22 closer to right angle by adjusting the surface angle of convex curved surface 12b. Thus, in spite of the change in the altitude of the sun throughout a year and of the movement of the sun throughout a day, it is possible to constantly reduce the reflectance on the surface of sealing area 15 for solar cell unit 22, and thus to increase the amount of power generation of solar cell unit 22.

In the same manner as the solar cell device of Embodiment 1, the solar cell device of Embodiment 3 may be manufactured by 1) laminating translucent back sheet 25, solar cell unit 22, translucent plastic material 12 in which an antireflective film and a gas barrier layer are formed, and transparent filling resin 3 represented by EVA to afford an integrated stack (laminating step); and 2) vacuum molding the afforded stack (vacuum molding step).

Figure 9:
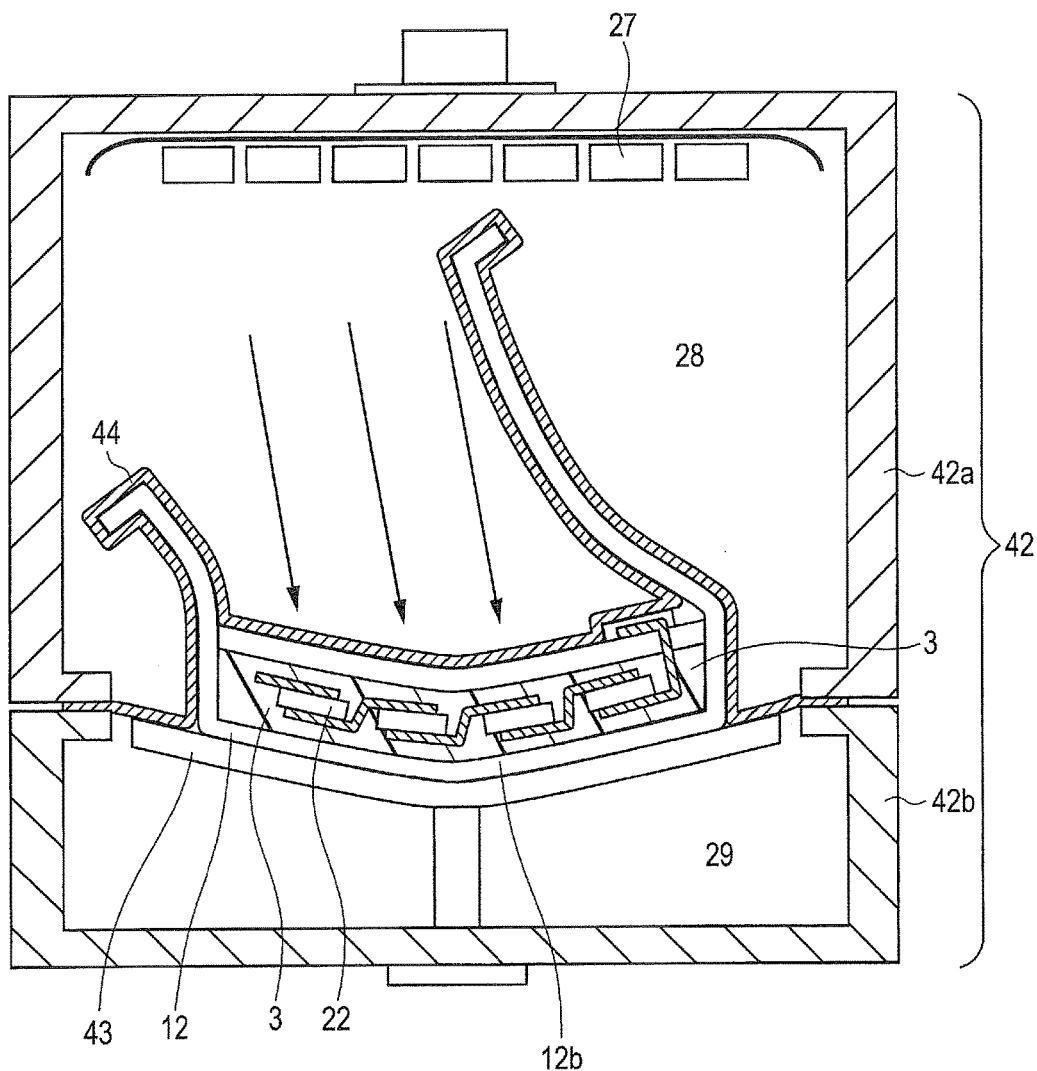
FIG. 9 illustrates a manufacturing flow of the solar cell device of Embodiment 3.

FIG. 9 illustrates a laminating step. The solar cell device of Embodiment 3 has convex curved surface 12b at sealing area 15 for solar cell unit 22 (see FIG. 8). Therefore, in the laminating step, solar cell unit 22 that performs double-sided power generation is pasted on convex curved surface 12b of translucent plastic material 12 having convex curved surface 12b. This lamination method is an applied method of general "decorative film method."

Curved surface laminator 42 has upper frame 42a and lower frame 42b, and concave heating die 43. Translucent plastic material 12 having a convex curved surface 12b is placed on concave heating die 43 inside the device of curved surface laminator 42. Further, in the same flows as those illustrated in FIGS. 2A, 2B and 2C, and 3A, 3B and 3C, solar cell unit 22, transparent filling resin 3, translucent back sheet 25, and the like are set on translucent plastic material 12 having a convex curved surface 12b placed on heating die 43 to afford a stacked product.

Next, upper frame 42a provided with elastic material sheet 44 is allowed to descend to wrap the afforded stacked product with elastic material sheet 44.

Next, the internal pressure of vacuum furnace 29 and the internal pressure of vacuum pressure furnace 28 are set to 130 Pa or lower. Then, the temperatures of heater 27 and heating die 43 are raised to heat transparent filling resin 3 to 40° C. to 80° C. Next, air is put into vacuum pressure furnace 28 to allow the internal pressure to be 0.5 to 2 atmospheres. In such a state, the temperatures of heater 27 and the heating die are raised to 100° C. to 150° C. to heat transparent filling resin 3 while applying pressure to cross-link transparent filling resin 3.

Subsequently, the temperatures of heater 27 and heating die 43 are lowered, and the internal pressures of vacuum pressure furnace 28 and vacuum furnace 29 are returned to the atmospheric pressure. Upper frame 42a and lower frame 42b are opened to thereby produce a stacked product including translucent plastic material 12 having a convex curved surface 12b.

Figure 10:
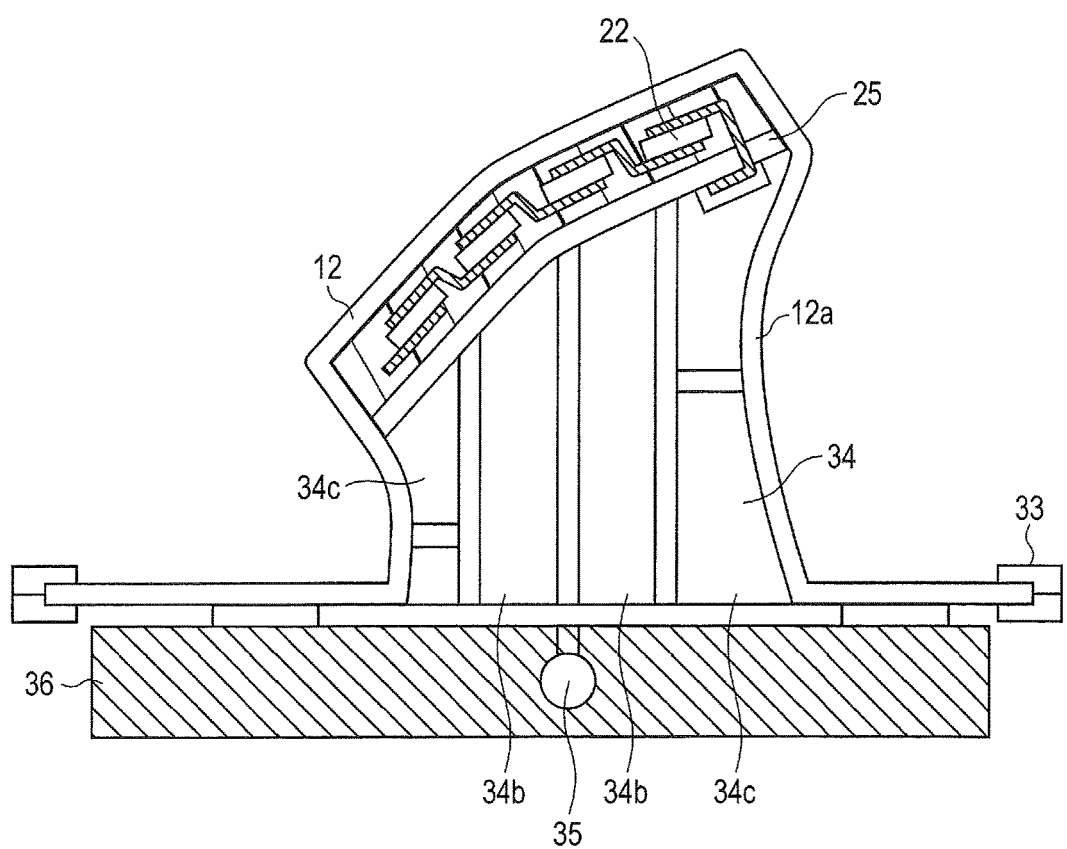
FIG. 10 illustrates the manufacturing flow of the solar cell device of Embodiment 3.

FIG. 10 illustrates a vacuum molding step. In the same manner as the vacuum molding step illustrated in FIG. 6, translucent plastic material 12 is brought into close contact with molding die 34 to allow translucent plastic material 12 to have a desired curved surface shape. Molding die 34 is composed of a plurality of split dies (split middle dies 34b and split outer dies 34c), and can be removed by splitting these dies. Therefore, after completion of the vacuum molding step illustrated in FIG. 10, split middle dies 34b are first moved downward in the drawing to be removed from molding die 34. Next, split outer dies 34c left inside the molded translucent plastic material can be drawn to be removed after having been moved toward the center portion. Thus, translucent plastic material 12 having concave curved surface 12a at the side surface can be formed, and molding die 34 can be easily removed.

When seen from molding die mounting base 36, for example, molding die 34 is split into nine portions: 3×3=9 in (X:Y) matrix. First, a split die at center portion (0:0) of (X:Y) matrix is removed, and next split dies at (1:0), (−1:0), (0:1) and (0:−1) are removed. Then, split dies at (1:1), (−1:−1), (1:−1) and (−1:1) are removed.

[Embodiment 4]

Figure 11:
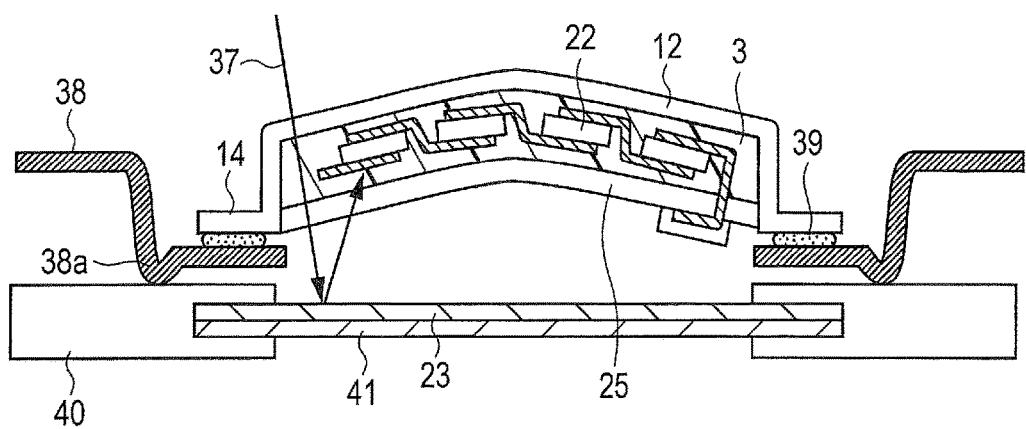
FIG. 11 is a sectional view of a solar cell device of Embodiment 4.

FIG. 11 illustrates a solar cell device of Embodiment 4. The solar cell device of Embodiment 4 is an application of the solar cell device of Embodiment 1, and is fixed to vehicle body 38 of an automobile roof as the fixing target. Specifically, frame portion 14 of translucent plastic material 12 of the solar cell device is fixed to vehicle body 38 by adhesive 39.

The solar cell device is fixed to vehicle body 38 to thereby allow the interior of the automobile to be closed airtight, so that wind and rain from the outside are prevented from entering the interior of the automobile. In particular, as illustrated in FIG. 11, providing vehicle body 38 with vehicle body concave portion 38a allows rainwater to flow out of the automobile along vehicle body concave portion 38a of vehicle body 38.

In addition, the solar cell device of Embodiment 4 may be fixed to vehicle body 38 of the automobile roof having a sunroof (skylight for taking light from the outside into an automobile). The solar cell device of Embodiment 4 may be composed of members that transmit light, other than solar cell unit 22 that performs double-sided power generation and interconnector 1. Therefore, even when the solar cell device of Embodiment 4 is mounted on vehicle body 38 of the automobile roof, the function of the sunroof can be maintained.

In addition, when the solar cell device of Embodiment 4 is fixed to vehicle body 38 of the automobile roof having a sunroof, car ceiling plate 40 to be disposed under vehicle body 38 can be provided with sliding plate 41. When sliding plate 41 is opened, sunlight can be taken into the automobile through the sunroof; when sliding plate 41 is closed, the sunlight is not taken into the automobile as sliding plate 41 shields the sunlight.

A surface, facing the solar cell device, of sliding plate 41 is preferably provided with light reflector 23. When sliding plate 41 is closed, sunlight 37 transmitted through the sunroof is reflected at light reflector 23 to be able to enter the rear surface of solar cell unit 22 that performs double-sided power generation. As a result, it is possible to achieve an increase in the amount of power generation of solar cell unit 22 that performs double-sided power generation.

[Embodiment 5]

Figure 12:
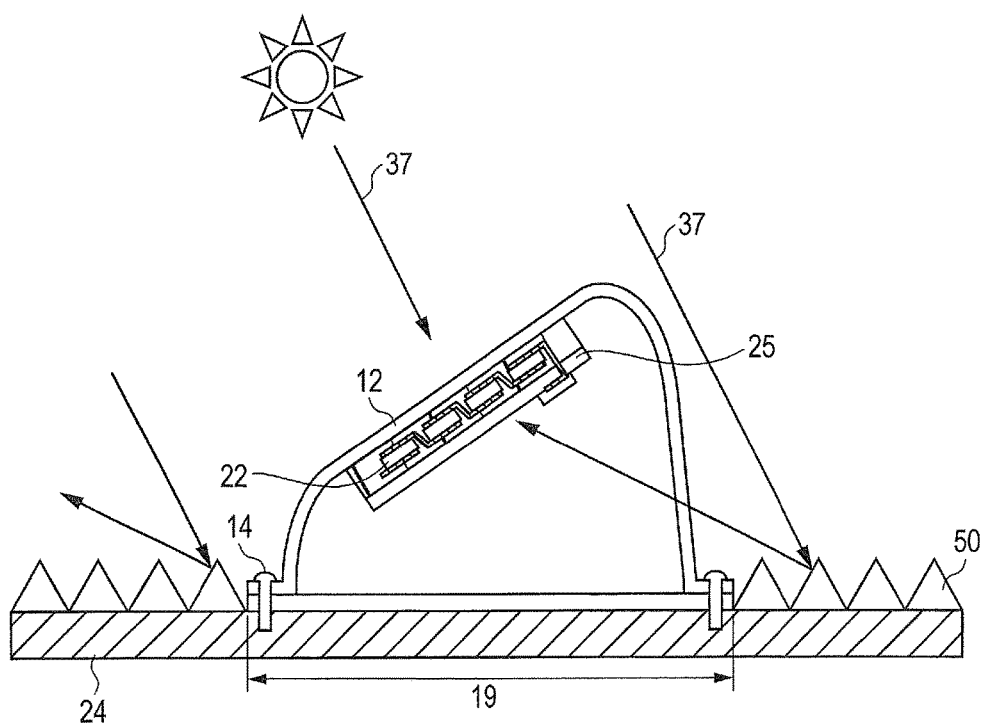
FIG. 12 is a sectional view of a solar cell device of Embodiment 5.

FIG. 12 illustrates a solar cell device of Embodiment 5. The solar cell device of Embodiment 5 has prism reflection sheet 50 disposed, on fixing target 24, around installing area 19 of the solar cell device; however other components are similar to those of the solar cell device of Embodiment 1. Prism reflection sheet 50 is, for example, a prism reflection sheet. The prism reflection sheet has, for example, triangular prisms formed on its surface.

Examples of prism reflection sheet 50 include white silicone resins, epoxy resins and urethane rubber, white coated polycarbonate and acrylic resin plates, and films coated with a liquid in which highly reflective shell powder is mixed.

Sunlight 37 having entered prism reflection sheet 50 is reflected toward double-sided light-receiving solar cell unit 22 to enable the power generation amount to be increased. The amount of power generation of double-sided light-receiving solar cell unit 22 can be increased, for example, by 10 to 20%.

The present application is entitled to and claims the benefit of Japanese Patent Application No. 2013-082309 filed on Apr. 10, 2013, the disclosure of which including the specification, drawings and abstract is incorporated herein by reference in its entirety.

INDUSTRIAL APPLICABILITY

A solar cell device of the present invention includes a translucent plastic material having a dome-shaped curved surface and having a frame being molded at the bottom surface of the dome. Thus, fixing the frame of the translucent plastic material to a fixing target can form an airtight space inside the dome. Therefore, the solar cell unit disposed inside the airtight space can be prevented from being stained by the outer space (due to wind and rain from the outside). In addition, the solar cell device of the present invention is lightweight and has higher rigidity. The solar cell device of the present invention can be used as a solar cell device for general household use, and commercial and automobile uses.

REFERENCE SIGNS LIST

1 Interconnector
1a Lead-out portion
2 Solar cell unit
3 Transparent filling resin
6 Stack
7 Frame body
11 Solar cell device
12 Translucent plastic material
12a Concave curved surface
12b Convex curved surface
14 Frame portion
15 Sealing area
19 Installing area
20 Airtight space
21 Fixing screw
22 Solar cell unit
23 Light reflector
24 Fixing target
25 Translucent back sheet
26 Joining material
27 Heater
27a Upper heater
27b, 27c Heater
27d Lower heater
28 Vacuum pressure furnace
29 Vacuum furnace
31 Heating metal plate
32 Terminal box
33 Fixing frame
34 Molding die
34a Vertex portion
34b Split middle die
34c Split outer die
35 Vacuum hole
36 Molding die mounting base
37 Sunlight
37a Reflected light
38 Vehicle body
38a Vehicle body concave portion
39 Adhesive
40 Car ceiling plate
41 Sliding plate
42 Curved surface laminator
42a Upper frame
42b Lower frame
43 Heating die
44 Elastic material sheet
45 Waterproof film
46 Close contact layer
50 Prism reflection sheet

The invention claimed is:

1. A solar cell device comprising:
a translucent plastic material;
a translucent back sheet;
a plurality of double-sided light-receiving solar cell units that are disposed between a sealing area of the translucent plastic material and the translucent back sheet and that are electrically connected with each other through an interconnector; and a transparent filling resin that surrounds the plurality of solar cell units, the transparent filling resin being disposed between the sealing area of the translucent plastic material and the translucent back sheet, wherein:

the translucent plastic material has an inner surface facing the plurality of solar cell units and an outer surface opposite to the inner surface, the translucent plastic material is a dome-shaped structure having a planar shape in the sealing area, a curved shape around the sealing area, and a frame portion at a bottom portion of the dome-shaped structure, the inner surface of the sealing area and the outer surface of the sealing area each have the planar shape, the frame portion is such that the bottom portion of the dome-shaped structure is bent outwardly so that the frame portion surrounds four sides of an entire perimeter of an installing area of a fixing target on which the solar cell device is installed, the frame portion is fixed to the installing area of the fixing target by a fixing screw or an adhesive such that the translucent plastic material forms an airtight space, the translucent back sheet, the plurality of solar cell units, and the transparent filling resin are disposed in the airtight space, the plurality of solar cell units, the transparent filling resin that surrounds the plurality of solar cell units, and the translucent back sheet are stacked on the inner surface on the sealing area of the translucent plastic material so as to form a planar shaped stacking body extending along the planar shape of the sealing area of the translucent plastic material, the plurality of solar cell units are disposed in an extended direction of the planar shaped stacking body, and the planar shaped stacking body is inclined at an angle relative to a surface of the installing area of the fixing target such that the plurality of solar cell units are inclined at the angle relative to the surface of the installing area of the fixing target.

2. The solar cell device according to claim 1, wherein a light reflector is provided at the installing area of the fixing target where the airtight space is formed.

3. The solar cell device according to claim 1, wherein the curved shape around the sealing area of the translucent plastic material is concave with respect to an outer space outside the solar cell device in order to efficiently guide sunlight into the airtight space.

4. The solar cell device according to claim 3, wherein:
an area of the installing area of the fixing target is smaller than an area of the sealing area of the translucent plastic material.

5. The solar cell device according to claim 1, wherein the curved shape around the sealing area of the translucent plastic material is convex with respect to the airtight space.

6. The solar cell device according to claim 1, wherein:
the fixing target is an automobile body of an automobile, and
the solar cell device is fixed to an automobile roof of the automobile body to thereby prevent wind and rain from entering the automobile.

7. The solar cell device according to claim 1, wherein a prism reflection sheet is provided around the installing area of the fixing target to allow sunlight reflected at the prism reflection sheet to enter the solar cell device.

8. The solar cell device according to claim 1, wherein the angle of the planar shaped stacking body is set so that the outer surface of the sealing area of the translucent plastic material is positioned at a right angle with an incident angle of sunlight.

* * * * *